United States Patent [19]

Pfizenmayer

[11] Patent Number: 5,073,983
[45] Date of Patent: Dec. 17, 1991

[54] OPTICAL COMMUNICATION SYSTEM WITH REDUCED DISTORTION

[75] Inventor: Henry L. Pfizenmayer, Phoenix, Ariz.

[73] Assignee: Motorola, Inc., Schaumburg, Ill.

[21] Appl. No.: 488,547

[22] Filed: Mar. 5, 1990

[51] Int. Cl.$^5$ .............................................. H04B 10/4
[52] U.S. Cl. ...................................... 359/187; 359/161
[58] Field of Search ............... 455/600, 609, 610, 611, 455/613, 618

[56] References Cited

U.S. PATENT DOCUMENTS

| | | | |
|---|---|---|---|
| 4,009,385 | 2/1977 | Sell | 455/618 |
| 4,399,566 | 8/1983 | Roullet | 455/618 |
| 4,501,022 | 2/1985 | Oswald | 455/613 |
| 4,504,976 | 3/1985 | Beaudet | 455/611 |
| 4,625,105 | 11/1986 | Hentschel | 455/618 |
| 4,709,416 | 11/1987 | Patterson | 455/609 |

FOREIGN PATENT DOCUMENTS

| | | | |
|---|---|---|---|
| 3232058 | 3/1984 | Fed. Rep. of Germany | 455/618 |
| 0277236 | 12/1986 | Japan | 455/618 |
| 0136932 | 6/1987 | Japan | 455/618 |
| 0151040 | 7/1987 | Japan | 455/618 |
| 0078626 | 4/1988 | Japan | 455/618 |

Primary Examiner—Curtis Kuntz
Assistant Examiner—L. Pascal
Attorney, Agent, or Firm—Joe E. Barbee; Robert M. Handy

[57] ABSTRACT

An amplitude modulated optical signaling system having improved linearity and reduced distortion is provided by detecting a portion of the optical output from the light emitter to obtain an electrical feedback signal and phase reversing a first portion of the feedback signal and degeneratively combining it with the electrical input signal of the system to obtain a combined signal for ac modulating the light emitter. A second portion of the feedback signal is desirably time averaged and used to control the dc drive to the light emitter so that the average light output is substantially constant. The distortion otherwise introduced into the optical signaling system by the non-linearity associated with optical emitters driven at high power levels is reduced.

2 Claims, 1 Drawing Sheet

OPTICAL COMMUNICATION SYSTEM WITH REDUCED DISTORTION

FIELD OF THE INVENTION

This invention concerns improved optical communication systems and, more particularly, optical communication systems with improved linearity and reduced distortion

BACKGROUND OF THE INVENTION

Optical signaling and communication systems are widely used in the art today. The optical signals may be transmitted through fiber optical cables or in free space or using mirrors or lenses or combinations thereof. In a typical system, an electrical signal is converted into an optical signal, transmitted through some media to a receiver and then used directly to modulate the properties of some receiving media and/or reconverted back to an electrical signal for further processing.

An important aspect of such optical communication systems is their linearity, that is, the degree to which the optical output of the transmitter or the electrical output of the receiver resembles the original electrical input signal, taking into account all of the harmonics, intermodulation and distortion products produced within the optical communication system. A significant problem with present day analog optical transmission or communication systems is that they are not particularly linear. This arises in part because they often must be operated at high levels in order to obtain sufficient optical output. As a consequence of the non-linearity, the optical signal can contain a significant amount of distortion and/or spurious signals generated within the optical system. This problem is exacerbated by the need to simultaneously generate or transmit several different information streams at the same time, as for example, by amplitude modulating an optical carrier with several different input signals at different average frequencies or on different sub-carriers.

Non-limiting examples of such spurious distortion products are second order harmonics (i.e., cross-modulation) and third-order harmonics (i.e., intermodulation and triplebeats). If a Fourier transform of the modulated optical signal is examined, these distortion products manifest themselves as spurious side-bands lying outside the modulation base-band around the optical carrier or subcarrier. Thus, there is an ongoing need to reduce the distortion products in analog optical generation and/or transmission systems.

SUMMARY OF THE INVENTION

Accordingly, it is an object of the present invention to provide an improved optical signaling system and method. It is a further object to provide a means and method having improved linearity and reduced distortion, especially in connection with amplitude modulated optical signaling systems. It is a still further object to provide an improved means and method in which the average or unmodulated output of the optical signalling system is also stabilized to reduce drift and thermal run-away.

The foregoing and other objects and advantages are provided by the invented arrangement comprising, an electrically modulatable light emitting means, a modulator means for electrically modulating the light emitting means in response to one or more electrical input signals and one or more feedback signals, an optical splitter means for directing a first portion of the optical output of the light emitting means toward a predetermined signal destination and directing a second portion of the output of the light emitting means to an optical receiver having an electrical output coupled to the modulator means, wherein the modulator means comprises an electrical signal conditioning means for treating the electrical output of the optical receiver to derive a feedback signal proportional to the electrical input signal plus distortion products formed within the signaling system which, when combined in opposite phase with the input signal for modulating the light emitting means, improves the linearity of the optical output directed toward predetermined signal destination. The modulator means preferably but not essentially amplitude modulates the emitting means.

It is desirable that the signal conditioning means comprise means for obtaining a first feedback signal varying at the same rate as the input signal and a second feedback signal proportional to the average optical output of the light emitting means. It is further desirable that the signal conditioning means comprise a control means responsive to the second feedback signal for holding the average light output substantially constant.

It is desirable that the signal conditioning means comprise means for subtracting the electrical signal received from the optical receiver from the input electrical signal or vice versa, to provide a combined signal proportional at least in part to distortion products generated within the system, but of opposite phase and that the modulator means modulate the light emitting means with the combined signal.

A method for reducing distortion in an optical signaling system is provided, comprising, modulating a light emitting means to provide an optical output therefrom, directing the optical output to an optical splitter wherein a first portion of the optical output is directed toward a predetermined signal destination and a second portion is directed to a local receiver, converting therein the second portion of the optical output to an electrical feedback signal containing a combination of an input signal plus distortion generated within the system, inverting the phase and adjusting the amplitude of the electrical feedback signal, and combining the phase inverted and amplitude adjusted feedback signal with the input signal desired to be transmitted to the signal destination, to provide a combined signal for modulating the light emitting means.

It is desirable that the method further comprise deriving from the electrical feedback signal a first feedback signal varying at least at the input signal rate and a second feedback signal proportional to the average optical output of the light emitting means, degeneratively combining the first feedback signal with the input signal, and using the second electrical signal to control the modulator means to hold the average output of the light emitting means substantially constant. The modulating step desirably comprises modulating the emitter to light output whose amplitude varies in response to the input signal.

The present invention will be more fully understood by reference to the accompanying drawings and the explanation thereof that follows.

DETAILED DESCRIPTION OF THE DRAWINGS

Figure 1:
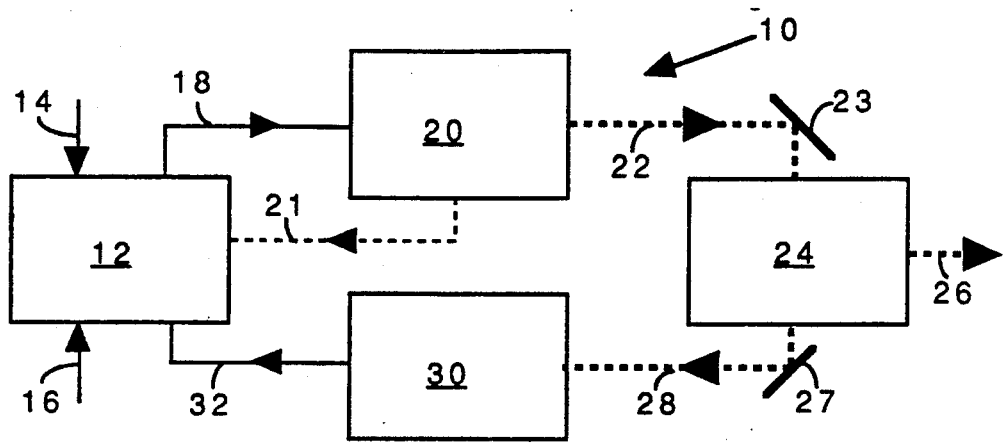
FIG. 1 is/a/simplified functional block diagram illustrating a first embodiment of the present invention.

FIG. 1 shows a simplified functional block diagram of the present invention, according to a first embodiment. System 10 for providing optical signaling comprises modulator 12, optical emitter 20, optical beam splitter 24 and optical receiver 30. Modulator 12 receives electrical input signal 14, i.e., the information to be transmitted by the optical signaling system, power supply input 16, electrical feedback signal 32 from optical receiver 30, and optional optical or electrical feedback signal 21 from emitter 20, and has output 18 for driving electrical emitter 20.

Optical emitter 20 provides optical output 22 which has been modulated to contain the information desired to be transmitted, and optional optical or electrical feedback output 21. Emitter 20 is conveniently an LED, although any electrically modulatable light source will also serve. Light emitting Diodes (LED's), Fabry-Perot laser diodes (FPLD's) and Distributed Feedback laser diodes (DFLD's) are useful in the present invention. Such devices are well known in the art. Examples of other useful optical emitters are lasers of various types which may be modulated directly or modulated indirectly by use of an electrically excited transmission (or reflection) modulator. Such apparatus is well known in the art.

Optical output 22 from emitter 20 is directed toward beam splitter 24 by first deflector means 23. Beam splitter 24 sends first portion 26 of optical beam 22 toward the intended signaling destination (not shown), and another portion 28 via second deflector means 27 to optical receiver 30. Deflection means 23, 27 may be mirrors, prisms or other apparatus capable of deflecting an optical beam. Beam splitter 24 may be a partly silvered mirror or double prisms or other apparatus capable of splitting an input optical beam into at least two portions.

While emitter 20, beam splitter 24 and receiver 30 are shown in FIG. 1 as being coupled by light beams 22, 26, 28 as if passing through air or space, this is merely for simplicity of explanation and, as those of skill in the art will appreciate, the same coupling may be achieved by use of fiber optic cables. When fiber optic cables are used to contain any or all of beams 22, 26, 28, one or more of deflectors 23, 27 and/or splitter 24 may be omitted since the fiber optic cables permit light to be bent around corners without need for separate deflectors and to have light (e.g., 22) arriving via an input fiber split into two beams (e.g., 26, 28) exiting through two output fibers. Such fiber optic cable, cable joining and fiber optic cable splitting components are well known in the art.

Figure 2:
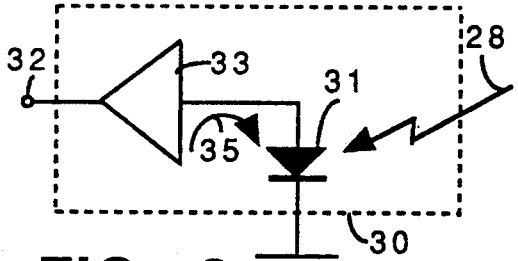

Receiver 30 converts portion 28 of light beam 22 from emitter 20 back to electrical signal 32. The internal arrangement of receiver 30 is illustrated, according to a preferred embodiment, in the schematic circuit diagram of FIG. 2, wherein receiver 30 comprises opto-electrical detector 31 and amplifier 33. Detector 31 is preferably an optically sensitive PN junction device, as for example a PIN diode or a PN junction transistor arranged to be light sensitive. Such detectors are well known in the art. Other types of detectors well known in the art could also be used. It is important that detector 31 and amplifier 33 be highly linear, that is, introduce as little distortion of their own as possible. This is possible because detector 31 and amplifier 33 may be arranged to operate at comparatively small signal levels so that signal distortion arising within receiver 30 is minimized.

Light 28 falling on detector 31 produces current 35 through amplifier 33. Amplifier 33 is preferably a "transimpedance" amplifier, that is, an amplifier which simultaneously provides gain and impedance transformation, e.g., a high input impedance and a low output impedance. In this manner, the small current generated within detector 31 is transformed into a sufficient voltage swing at electrical feedback output 32 to be conveniently interfaced to the control circuitry in modulator 12. While amplifier 33 is shown as being a part of receiver 30, it may alternatively be included in modulator 12. Transimpedance amplifiers are well known in the art.

Figure 3:
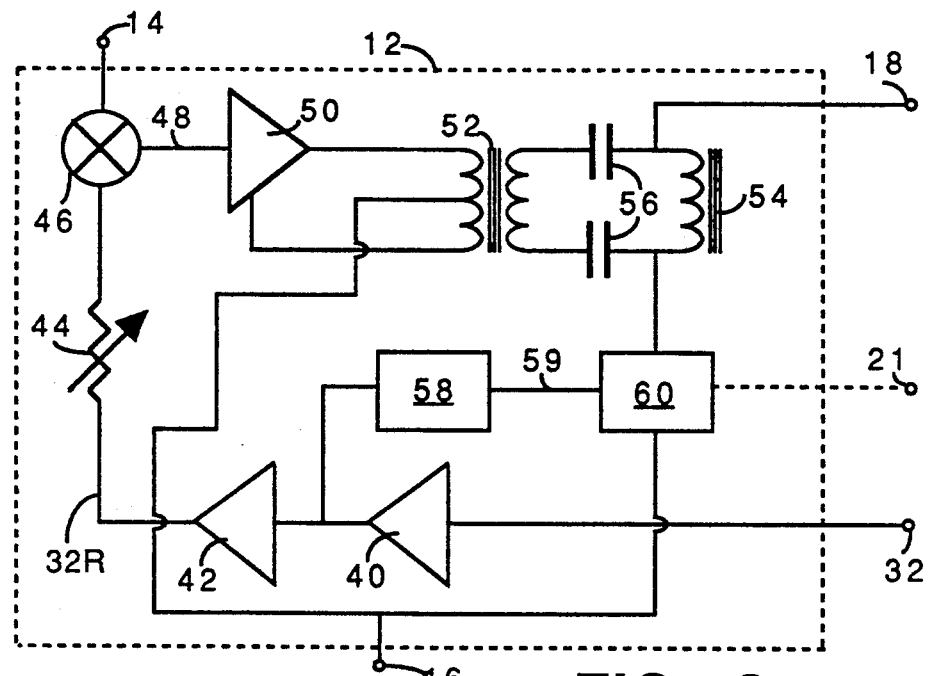
FIGS. 2-3 are simplified electrical schematic diagrams of portions of the block diagram of FIG. 1.

FIG. 3 is a simplified electrical schemical diagram of modulator 12 showing further details. Modulator 12 preferably comprises buffer amplifiers 40, 42 wherein the phase of feedback signal 32 is inverted with respect to input signal 14. Phase reversed feedback signal 32R from buffer/inversion amplifiers 40, 42 is fed through level adjuster 44 to combiner 46 where it is algebraically added to input signal 14. Level adjuster 44 is provided to control the magnitude of the fed-back signal and the feedback loop gain. A variable resistor conveniently serves as level adjuster 44, although any variable impedance having the desired range of values may be used. A resistor also conveniently serves as combiner 46. Those of skill in the art will understand how to choose the values of such components based on the description herein. The pass-band of amplifiers 40, 42 must at least include the frequencies of the distortion products desired to be reduced or eliminated.

Adding phase reversed signal 32R to input signal 14 has the same effect as subtracting non-phase reversed signal 32 to input signal 14. What is desired is that the feedback in going around the loop from combiner 46 through amplifier 50, transformer 52, capacitors 56, emitter 20, splitter 24, receiver 30, level adjust 44 and back to combiner 46, be degenerative, i.e., be negative feedback. Any means of providing this combined electrical-optical degenerative feedback so as to reduce the distortion introduced into optical signal 26 from within the system, will serve.

Signal 48 resulting from the combination of input signal 14 and feedback signal 32R in combiner 46, is fed to driver amplifier 50. Amplifier 50 must have a band width which exceeds the highest frequency to be transmitted on output optical beam 26. It is desirable that amplifier 50 be linear, but this is not essential since the feedback loop reduces not only the distortion introduced into optical signal 22 by emitter 20 but also the distortion introduced by amplifier 50, transformer 52 and inductor 54. Amplifier 50 is ac coupled to modulator output 18 by transformer 52 and capacitors 56. The dc power for amplifier 50 is conveniently obtained from dc input terminal 16 via the center tap of transformer 52.

Average detector 58 provides output 59 proportional to the time average of feedback signal 32, which in turn is related to the time average value of light output 22. The time average generated by detector 58 should be taken over a time period equal to or greater than the longest period of input signal 14, preferably about ten times the period. Time average 59 is fed back through dc controller 60 and inductor 54 to modulator output 18 to keep the average light output from emitter 20 substantially constant. This prevents thermal run-away and/or long term drift of emitter 20. The dc power needed for modulator output signal 18 is conveniently obtained from dc input 16 via dc controller 60.

Means for controlling dc power in response to a time averaged feedback signal are well known in the art. All that is required is that an increase in light output 22 above a pre-determined desired value cause a decrease in the dc power being supplied through controller 60 and transformer 54 so as to return light output 22 from emitter 20 to its predetermined optical output level.

Optional feedback loop 21 from emitter 20 to controller 60 provides a signal proportional to, for example, the temperature of emitter 20 or the voltage across emitter 20 or the current through emitter 20 or a combination of the above. This may also be used to set and hold the average operating point of emitter 20 or avoid temperatures in excess of a predetermined maximum. For example, a temperature sensor (e.g., another PN junction) placed immediately adjacent to LED emitter 20, (e.g., on the same semiconductor chip) can measure the temperature of LED emitter 20 and, using conventional means for providing the necessary gain and sensitivity, can adjust dc drive control 60 so as to hold the temperature of LED 20 substantially constant or at least below some predetermined value. Means for accomplishing feedback temperature control are well known in the art.

Feedback signal 21 is desirable because it is based on the power being dissipated within the emitter or the emitter temperature, rather than the light output It is known for example that light output efficiency of LED's operated at very high levels can decrease slowly with time. Thus, a stabilization system based only on the average light output (e.g., on feedback signal 59) would slowly increase the dc drive current to compensate for the loss of efficiency. This would produce a corresponding increase in power dissipation and emitter temperature. Unless there is also temperature or dc power dissipation feedback (e.g., feedback signal 21), emitter thermal or power ratings could be exceeded.

Figure 4:
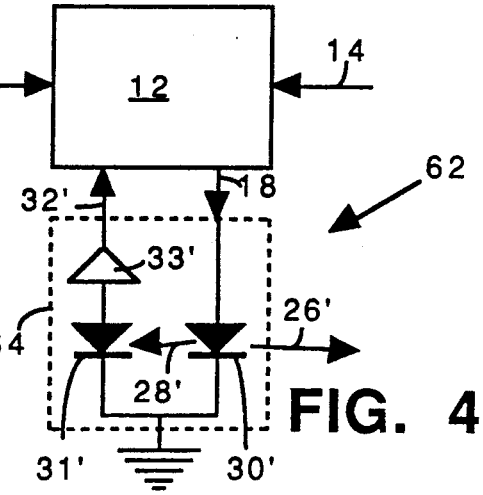
FIG. 4 is a simplified functional block diagram similar to FIG. 1, but according to a further embodiment of the present invention.

FIG. 4 shows further embodiment 62 of the present invention, wherein the functions of emitter 20, splitter 24 and detector 30 are combined in element 64. Element 64 contains emitter 30', e.g., an LED, closely optically coupled to detector 31', so that optical feedback signal 28' passes substantially directly from emitter 30' to receiver 31' with minimum intervening elements or spacing, and optical output signal 26' is directed toward the intended optical receiver without need for splitter 24. Splitter 24 is essentially internal to element 64. This is accomplished, for example, by constructing LED emitter 30' and detector 31' on the same substrate and with their respective light emitting and light sensing junctions aligned sufficiently to permit optical coupling therebetween.

Figure 5:
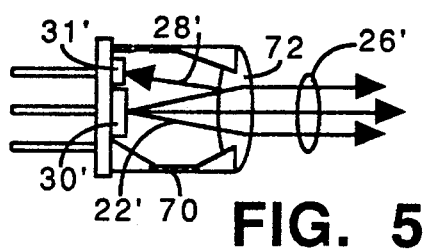
FIG. 5 is a simplified partial cut-away view of a combined optical emitter and detector suitable for use in connection with the present invention.

Means for constructing optical emitting and sensing PN junctions on a common III-v chip or on adjacent III-V chips or on a pair of closely coupled III-V emitter and Si sensor chips, are well known in the art. FIG. 5 illustrates a particularly simple arrangement in which III-v emitter 30' and Si detector 31' are mounted side-by-side within common housing 70 having output lense 72, wherein the small amount of scattered light that is reflected within housing 70 and/or from lense 72 is sufficient to provide optical feedback signal 28' to detector 31'.

Modulator 12 in FIG. 4 functions in the same way as previously described providing drive signal 18 to drive emitter 30'. Feedback signal 32' is derived from detector 31' through amplifier 33', also in the same manner as previously described. Those of skill in the art will further appreciate that amplifier 33' may also be integrated or combined with detector 31' so that element 64 is especially compact.

Based on the foregoing explanations, it will be apparent to those of skill in the art that the present invention provides an improved optical signaling system and method, and further provides a means and method having improved linearity and reduced distortion, especially in connection with amplitude modulated optical signaling systems. It is still further apparent that the present invention provides an improved means and method in which the average or un-modulated output of the optical signalling system is also stabilized to reduce drift and thermal runaway.

While the present invention has been described in terms of particular examples, those of skill in the art will understand based on the material presented herein that this is merely for convenience of explanation and not intended to be limiting. For example, while emitter 30 has been described as being preferably an LED, other modulatable light sources may also be used. Further, while a particular set of elements are illustrated for providing the desired degenerative opto-electrical feedback, other combinations and structures may also be used. Accordingly, it is intended to include these and other variations as will occur to those of skill in the art based on the descriptions herein in the claims that follow.

I claim:

1. An optical signaling system comprising, electrically modulatable light emitting means for producing light output, modulator means for electrically modulating the light emitting means in response to one or more electrical input signals and one or more feedback signals, means for directing a first portion of the light output to a predetermined first signal destination and directing a second portion of the light output to an optical receiver having an electrical output related to the light output, wherein the modulator means comprises an electrical signal conditioning means for treating the electrical output of the optical receiver to derive a feedback signal proportional to the electrical input signal plus distortion products formed within the signaling system which, when combined with the input signal for modulating the light emitting means, improves the linearity of the optical signaling system, wherein the feedback signal further comprises a first feedback signal having an upper frequency at least equal an input signal frequency and a second feedback signal proportional to an average light optical output of the light emitting means, wherein the second feedback signal is time averaged over a time interval at least ten times a period of the electrical input signal, and wherein the signal conditioning means further comprises means for subtracting the first feedback signal from the input electrical signal, to provide a combined signal proportional at least in part to distortion products generated within the system but of opposite phase.

2. A method for reducing distortion in an optical signaling system comprising:

modulating a light emitting means to provide an optical output therefrom;

directing a first portion of the optical output to a predetermined signal destination and a second portion to an optical detector;

in the optical detector, converting the second portion of the optical output to an electrical feedback signal containing a combination of input signal information plus distortion generated within the light emitting means;

inverting the phase and adjusting the amplitude of a first portion of the electrical feedback signal;

degeneratively combining the first portion of the feedback signal with an input signal desired to be transmitted to the signal destination, to provide a combined signal for modulating the light emitting means;

using a second portion of the electrical feedback signal to derive a control signal proportional to an average light output;

using the control signal to adjust the average light output so as to hold the average light output substantially at a predetermined value or values; and deriving the control signal by averaging the second portion of the electrical feedback signal over a time interval which is at least ten times a period of the input signal.

* * * * *